US008101979B2

(12) United States Patent
Choi

(10) Patent No.: US 8,101,979 B2
(45) Date of Patent: Jan. 24, 2012

(54) ORGANIC LIGHT-EMITTING DISPLAY APPARATUS

(75) Inventor: Jong-Hyun Choi, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 433 days.

(21) Appl. No.: 12/052,010

(22) Filed: Mar. 20, 2008

(65) Prior Publication Data
US 2008/0303023 A1 Dec. 11, 2008

(30) Foreign Application Priority Data

Jun. 5, 2007 (KR) .................. 10-2007-0055275

(51) Int. Cl.
H01L 29/80 (2006.01)
(52) U.S. Cl. ........ 257/257; 257/184; 257/187; 257/258; 257/290; 257/291; 257/E33.001
(58) Field of Classification Search .......... 257/184, 257/187, 257, 258, 290, 291
See application file for complete search history.

(56) References Cited

U.S. PATENT DOCUMENTS
2005/0263771 A1* 12/2005 Yamazaki et al. .............. 257/72
2005/0269959 A1* 12/2005 Uchino et al. ............. 315/169.3
2007/0188421 A1* 8/2007 Koyama ......................... 345/76

FOREIGN PATENT DOCUMENTS
KR 2007-31644 3/2007

OTHER PUBLICATIONS
Office Action issued by the Korean Intellectual Property Office on Apr. 28, 2008 in Korean Patent Application No. 2007-55275.

* cited by examiner

Primary Examiner — Wai Sing Louie
(74) Attorney, Agent, or Firm — H.C. Park & Associates, PLC

(57) ABSTRACT

An organic light-emitting display apparatus includes a plurality of pixels arranged on a substrate, each pixel includes: a display region including at least one pixel thin film transistor and an organic light-emitting device electrically connected to the pixel thin film transistor; and a sensor region electrically connected to the display region to affect an image display of the display region.

18 Claims, 3 Drawing Sheets

ORGANIC LIGHT-EMITTING DISPLAY APPARATUS

CROSS-REFERENCE TO RELATED APPLICATION

This application claims the benefit of Korean Application No-2007-55275, filed on Jun. 5, 2007, in the Korean Intellectual Property Office, the disclosure of which is incorporated herein by reference.

BACKGROUND OF THE INVENTION

1. Field of the Invention

An aspect of the present invention relates to an organic light-emitting display apparatus, and more particularly, to an active matrix organic light-emitting display apparatus in which each pixel includes a sensor.

2. Description of the Related Art

Organic light-emitting display apparatuses are display apparatuses wherein a light-emitting layer made of an organic material is interposed between a pixel electrode and an opposite electrode.

In organic light-emitting display apparatuses, when positive and negative voltages are respectively applied to a pixel electrode and an opposite electrode, holes released from the pixel electrode are transported to a light-emitting layer via a hole transport layer and electrons released from the opposite electrode are transported to the light-emitting layer via an electron transport layer. At this time, the electrons and the holes are recombined with each other and broken in the light-emitting layer to generate excitons. While the excitons move from an excited state to a ground state, energy is transmitted to fluorescent molecules of the light-emitting layer, and thus, the fluorescent molecules emit light, thereby displaying images.

Such organic light-emitting display apparatuses are classified into Active Matrix (AM) types and Passive Matrix (PM) types according to their driving methods. The AM organic light-emitting display apparatuses have been widely used since they can display high-quality images.

Meanwhile, there is demand for an integrated display apparatus with various additional functions. For example, an integrated display apparatus with a touch panel, image readout function, or the like has been developed.

However, when such a functional element is separately added to a display apparatus, additional costs are incurred, and a space for the installation of the functional element, a connector for connecting the functional element to the display apparatus, etc., are needed, thereby making it difficult to manufacture lightweight, small-sized display apparatuses.

In this regard, it is necessary to develop an AM organic light-emitting display apparatus that can be easily operated and which can display high-quality images, without adding sensors with various additional functions as separate elements.

SUMMARY OF THE INVENTION

An aspect of the present invention provides an active matrix organic light-emitting display apparatus in which sensing units, together with thin film transistors, are respectively formed in pixels. Therefore, the active matrix organic light-emitting display apparatus can be easily operated and display high-quality images with no additional separate elements.

According to an aspect of the present invention, there is provided an organic light-emitting display apparatus including a plurality of pixels arranged on a substrate, each pixel including: a display region including at least one pixel thin film transistor and an organic light-emitting device electrically connected to the pixel thin film transistor; and a sensor region electrically connected to the display region to affect an image display of the display region.

According to another aspect of the present invention, the sensor region may include a sensor thin film transistor in which an amorphous silicon layer, a first insulating layer, and a sensor gate electrode are sequentially stacked; a charging unit in which a first charging electrode, the first insulating layer, and a second charging electrode are sequentially stacked, the first charging electrode including a polysilicon layer placed on the same plane as the amorphous silicon layer and the second charging electrode being placed on the same plane as the sensor gate electrode; and a switch thin film transistor in which a polysilicon layer, the first insulating layer, and a switch gate electrode are sequentially stacked, the polysilicon layer being placed on the same plane as the first charging electrode and the switch gate electrode being placed on the same plane as the second charging electrode.

According to another aspect of the invention, the sensor gate electrode, the second charging electrode, and the switch gate electrode may be made of metal.

According to another aspect of the invention, the sensor region may include a second insulating layer disposed on the sensor gate electrode, the second charging electrode, and the switch gate electrode, the sensor thin film transistor may include a first source electrode and a first drain electrode disposed on the second insulating layer, the first source electrode and the first drain electrode being electrically connected to the amorphous silicon layer via contact holes, the switch thin film transistor may include a second source electrode and a second drain electrode disposed on the second insulating layer, the second source electrode and the second drain electrode being electrically connected to the polysilicon layer via contact holes, and one of the first source electrode and the first drain electrode and one of the second source electrode and the second drain electrode may be connected to the second charging electrode via contact holes.

According to another aspect of the invention, the sensor thin film transistor may generate photocurrent.

According to another aspect of the invention, in the pixel thin film transistor, a polysilicon layer, the first insulating layer, and a pixel gate electrode may be sequentially stacked, and the polysilicon layer may be placed on the same plane as the amorphous silicon layer of the sensor region.

According to another aspect of the invention, the pixel gate electrode may be placed on the same plane as the sensor gate electrode, the second charging electrode, and the switch gate electrode of the sensor region, and may be made of metal.

According to another aspect of the invention, the display region may include the second insulating layer disposed on the pixel gate electrode, the pixel thin film transistor may include a third source electrode and a third drain electrode disposed on the second insulating layer, and the third source electrode and the third drain electrode may be electrically connected to the polysilicon layer via contact holes.

According to another aspect of the invention, the organic light-emitting device may include a first electrode, a light-emitting layer, and a second electrode, and the first electrode may be connected to one of the third source electrode and the third drain electrode.

According to another aspect of the invention, the organic light-emitting display apparatus may further include a buffer layer disposed on the substrate.

According to another aspect of the invention, the sensor region may include a sensor thin film transistor in which an amorphous silicon layer, a first insulating layer, a sensor gate electrode, and a second insulating layer are sequentially stacked; a charging unit in which a first charging electrode, the first insulating layer, a second charging electrode, and the second insulating layer are sequentially stacked, the first charging electrode including a polysilicon layer placed on the same plane as the amorphous silicon layer and the second charging electrode being placed on the same plane as the sensor gate electrode; and a switch thin film transistor in which the first insulating layer, a polysilicon layer, the second insulating layer, and a switch gate electrode are sequentially stacked, the polysilicon layer being placed on the same plane as the second charging electrode.

According to another aspect of the invention, the sensor gate electrode and the first charging electrode may be made of polysilicon, and the switch gate electrode may be made of metal.

According to another aspect of the invention, the sensor region may include a third insulating layer disposed on the second insulating layer and the switch gate electrode, the sensor thin film transistor may include a first source electrode and a first drain electrode disposed on the third insulating layer, the first source electrode and the first drain electrode being electrically connected to the amorphous silicon layer via contact holes, the switch thin film transistor may include a second source electrode and a second drain electrode disposed on the third insulating layer, the second source electrode and the second drain electrode being electrically connected to the polysilicon layer via contact holes, and one of the first source electrode and the first drain electrode and one of the second source electrode and the second drain electrode may be connected to the second charging electrode via contact holes.

According to another aspect of the invention, the sensor thin film transistor may generate photocurrent. In the pixel thin film transistor, the first insulating layer, a polysilicon layer, the second insulating layer, and a pixel gate electrode may be sequentially stacked, the polysilicon layer may be placed on the same plane as the polysilicon layer of the switch thin film transistor, and the pixel gate electrode may be placed on same plane as the switch gate electrode.

According to another aspect of the invention, the display region may include the third insulating layer disposed on the pixel gate electrode, the pixel thin film transistor may include a third source electrode and a third drain electrode disposed on the third insulating layer, and the third source electrode and the third drain electrode may be electrically connected to the polysilicon layer via contact holes.

According to another aspect of the invention, the organic light-emitting device may include a first electrode, a light-emitting layer, and a second electrode, and the first electrode may be connected to one of the third source electrode and the third drain electrode.

According to another aspect of the invention, the organic light-emitting display apparatus may further include a buffer layer disposed on the substrate, and an image may be displayed in an opposite direction to the substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
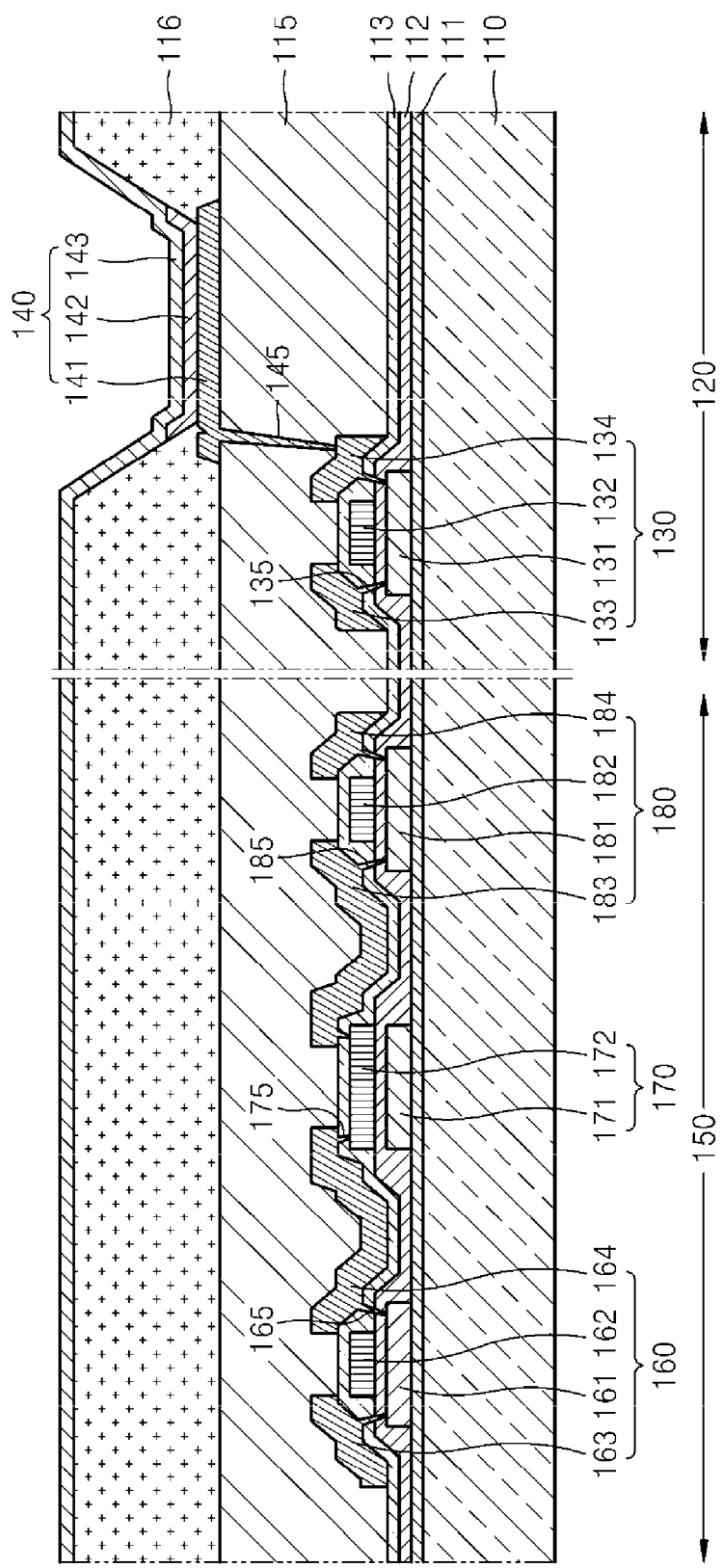
FIG. 1 is a schematic sectional view illustrating a pixel of an organic light-emitting display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
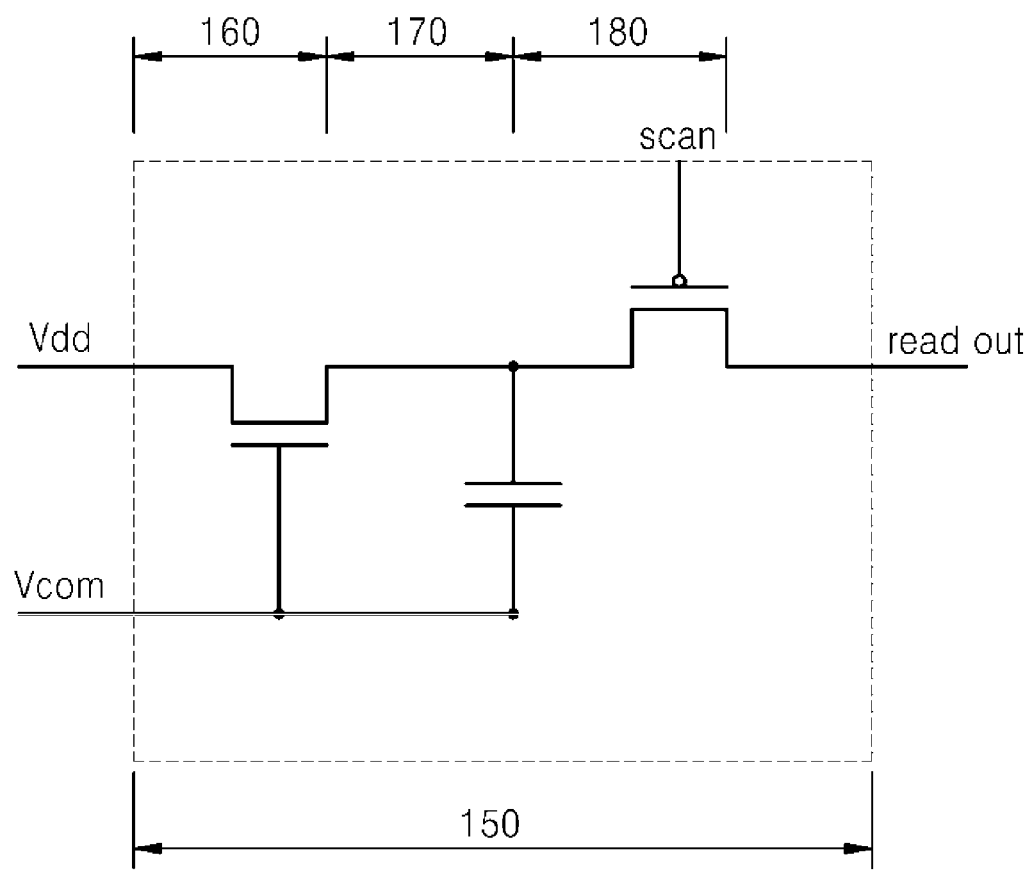
FIG. 2 is a circuit view of a sensor region of FIG. 1.

FIG. 1 is a schematic sectional view illustrating a pixel of an organic light-emitting display apparatus according to an embodiment of the present invention and FIG. 2 is a circuit view of a sensor region of FIG. 1.

Referring to FIGS. 1 and 2, an organic light-emitting display apparatus includes a substrate 110 including a plurality of pixels, and each pixel includes a display region 120 and a sensor region 150.

The substrate 110 may be made of a transparent glass material including $SiO_2$ as a main component. However, the present invention is not limited thereto, and the substrate 110 may also be made of a transparent plastic material. In a bottom-emission type organic light-emitting display apparatus that displays images toward the substrate 110, the substrate 110 is made of a transparent material. However, like the current embodiment of the present invention, in a top-emission type organic light-emitting display apparatus that displays images in an opposite direction to the substrate 110 to achieve a larger aperture ratio, it is not necessary to form the substrate 110 using a transparent material.

A buffer layer 111 may be disposed on the substrate 110 to make the substrate 110 smooth and to prevent the penetration of impurity elements. The buffer layer 111 may be made of $SiO_2$ and/or SiNx.

Each pixel defined on the substrate 110 includes the display region 120 for displaying images and the sensor region 150 for sensing light and transmitting signals to the display region 120.

The sensor region 150 includes a sensor Thin Film Transistor (TFT) 160 sensing light, a charging unit 170 storing photocurrent as charges, and a switch TFT 180 selectively releasing the charges stored in the charging unit 170.

The sensor TFT 160 includes an amorphous silicon layer 161, a first insulating layer 112, and a sensor gate electrode 162. A second insulating layer 113 is disposed on the sensor gate electrode 162, and a first source electrode 163 and a first drain electrode 164 are electrically connected to the amorphous silicon layer 161 via contact holes 165.

In order for the sensor TFT 160 to be used as a photosensitive device generating photocurrent, a material with good photo-sensitivity and photoelectric conversion property must be used. The material may be a hydrogen-containing amorphous silicon.

The amorphous silicon layer 161 is disposed closer than the sensor gate electrode 162 to the substrate 110. Thus, the amorphous silicon layer 161 can sense light incident to the substrate 110. In particular, in a top-emission type organic light-emitting display apparatus, a light receiving plane is opposite to an image display plane, and thus, the display apparatus can easily perform image readout.

The charging unit 170 has a sequential staked structure of a first charging electrode 171, the first insulating layer 112, and a second charging electrode 172, and the second insulating layer 113 is disposed on the second charging electrode 172.

Here, the first charging electrode 171 is made of polysilicon and placed on the same plane as the amorphous semiconductor layer 161 of the sensor TFT 160. The second charging electrode 172 is made of metal and placed on the same plane as the sensor gate electrode 162 of the sensor TFT 160. Methods of forming the first charging electrode 171 and the second charging electrode 172 will be described later.

Meanwhile, photocurrent generated in the amorphous silicon layer 161 of the sensor TFT 160 migrates to the first source electrode 163 or the first drain electrode 164 via the contact holes 165 of the sensor TFT 160 and then to the second charging electrode 172 electrically connected to the first source electrode 163 or the first drain electrode 164 to thereby be stored as charges in the charging unit 170.

The switch TFT 180 includes a polysilicon layer 181, the first insulating layer 112, and a switch gate electrode 182. The second insulating layer 113 is disposed on the switch gate electrode 182, and a second source electrode 183 and a second drain electrode 184 are electrically connected to the polysilicon layer 181 via contact holes 185.

The polysilicon layer 181 is placed on the same plane as the first charging electrode 171 of the charging unit 170, and is made of polysilicon, like the first charging electrode 171. Polysilicon has better electron mobility than amorphous silicon, thereby guaranteeing a rapid operating speed. Thus, polysilicon is used for a switching device (e.g., a pixel TFT 130 as will be described later) that must be operated together with an element(s) constituting an organic light-emitting device 140.

The switch gate electrode 182 is placed on the same plane as the second charging electrode 172 of the charging unit 170, and is made of a metal material, like the second charging electrode 172.

Meanwhile, charges stored in the charging unit 170 are transmitted to the switch TFT 180 via the second source electrode 183 of the switch TFT 180 and then to the display region 120 via the second drain electrode 184 of the switch TFT 180 electrically connected to the display region 120.

In the current embodiment of the present invention, the sensor TFT 160, the charging unit 170, and the switch TFT 180 constituting the sensor region 150 are electrically connected to each other through the first source and drain electrodes 163 and 164, the second charging electrode 172, and the second source and drain electrodes 183 and 184. FIG. 1 is an exemplary sectional view of an embodiment of the present invention cut along the interconnection parts of the sensor TFT 160, the charging unit 170, and the switch TFT 180. However, it should be understood by those of ordinary skill in the art that the sensor TFT 160, the charging unit 170, and the switch TFT 180 can be variously arranged.

The display region 120 includes at least one pixel TFT 130 and an organic light-emitting device 140 electrically connected to the pixel TFT 130.

The pixel TFT 130 includes a polysilicon layer 131 placed on the same plane as the amorphous silicon layer 161 of the above-described sensor region 150, the first insulating layer 112, and a pixel gate electrode 132. Here, the pixel gate electrode 132 is placed on the same plane as the sensor gate electrode 162, the second charging electrode 172, and the switch gate electrode 182 of the sensor region 150, and is made of a metal material, like the sensor gate electrode 162, the second charging electrode 172, and the switch gate electrode 182 of the sensor region 150. Methods of forming the pixel gate electrode 132, the sensor gate electrode 162, the second charging electrode 172, and the switch gate electrode 182 will be described later.

The second insulating layer 113 is disposed on the pixel gate electrode 132, and third source and drain electrodes 133 and 134 are electrically connected to the polysilicon layer 131 via contact holes 135.

Meanwhile, one of the third source and drain electrodes 133 and 134 is electrically connected to a first electrode 141 of the organic light-emitting device 140.

A passivation layer 115 is interposed between the third source and drain electrodes 133 and 134 and the first electrode 141 to protect TFT devices. The passivation layer 115 may be formed as an inorganic insulating layer and/or an organic insulating layer. The inorganic insulating layer may include $SiO_2$, $SiNx$, $SiON$, $Al_2O_3$, $TiO_2$, $Ta_2O_5$, $HfO_2$, $ZrO_2$, BST, PZT, or the like, and the organic insulating layer may include a general commercial polymer (e.g., PMMA, PS), a phenol-based polymer derivative, an acrylic polymer, an imide-based polymer, an arylether-based polymer, an amide-based polymer, a fluorine-based polymer, a p-xylene-based polymer, a vinylalcohol-based polymer, or a blend thereof. The passivation layer 115 may also be a composite stack of an inorganic insulating layer and an organic insulating layer.

In a bottom-emission type organic light-emitting display apparatus that displays images toward the substrate 110, the first electrode 141 of the organic light-emitting device 140 may be a transparent electrode, and a second electrode 143 may be a reflective electrode. Here, the first electrode 141 may be made of a material having a high work function, e.g., ITO, IZO, ZnO, or $In_2O_3$, and the second electrode 143 may be made of metal having a low work function, e.g., Ag, Mg, Al, Pt, Pd, Au, Ni, Nd, Ir, Cr, Li, or Ca.

On the other hand, in a top-emission type organic light-emitting display apparatus that displays images in an opposite direction to the substrate 110 to achieve a large aperture ratio, the first electrode 141 may be a reflective electrode, and the second electrode 143 may be a transparent electrode. When the first electrode 141 is formed as a reflective electrode, a material having a high work function, e.g., ITO, IZO, ZnO, or $In_2O_3$ may be formed on a reflective film made of Ag, Mg, Al, Pt, Pd, Au, Ni, Nd, Ir, Cr, Li, Ca, or a compound thereof. When the second electrode 143 is formed as a transparent electrode, an auxiliary electrode layer or a bus electrode line made of a transparent conductive material, e.g., ITO, IZO, ZnO, or $In_2O_3$ may be formed on a layer made of metal having a low work function, e.g., Ag, Mg, Al, Pt, Pd, Au, Ni, Nd, Ir, Cr, Li, or Ca, or a compound thereof.

Meanwhile, an organic light-emitting layer 142 interposed between the first electrode 141 and the second electrode 143 emits light according to electrical operation of the first electrode 141 and the second electrode 143. The organic light-emitting layer 142 may be made of a low molecular weight or polymer organic material.

When the organic light-emitting layer 142 is made of a low molecular weight organic material, a hole transport layer and a hole injection layer are disposed on a surface of the organic light-emitting layer 142 facing the first electrode 141, and an electron transport layer and an electron injection layer are disposed on a surface of the organic light-emitting layer 142 facing the second electrode 143. In addition, when needed, various layers may be disposed between the first electrode 141 and the second electrode 143. A low molecular weight organic material that can be used herein may be copper phthalocyanine (CuPc), N,N'-di(naphthalene-1-yl)-N,N'-diphenyl-benzidine (NPB), tris-8-hydroxyquinoline aluminum (Alq3), etc.

When the organic light-emitting layer 142 is made of a polymer organic material, only a hole transport layer (HTL) may be disposed on a surface of the organic light-emitting layer 142 facing the first electrode 141. Here, the hole transport layer may be formed on the first electrode 141 by inkjet printing or spin coating using polyethylene dihydroxythiophene (PEDOT: poly-(2,4)-ethylene-dihydroxy thiophene) or polyaniline (PANI), and the organic light-emitting layer 142 may be color-patterned by a common method, e.g., inkjet printing, spin coating, or laser-induced thermal transfer, using PPV, soluble PPV, cyano-PPV, polyfluorene, or the like.

Although not shown, a sealing member (e.g., glass) sealing the organic light-emitting device 140 may be disposed on the organic light-emitting device 140, and a hygroscopic agent absorbing external moisture or oxygen may be further provided.

FIG. 1 illustrates that the display region 120 includes merely the pixel TFT 130 and the organic light-emitting device 140, but the present invention is not limited thereto. Of course, in some cases, the display region 120 can include various compensation circuits, and thus, further include a plurality of TFTs and capacitors. Thus, although not shown, the switch TFT 180 can be directly electrically connected to the pixel TFT 130, and in some cases, can also be electrically connected to various devices arranged in the display region 120.

Methods of forming stack structures on the substrate 110 to manufacture the organic light-emitting display apparatus according to the current embodiment of the present invention will now be described in more detail. First, the buffer layer 111 is formed on the substrate 110.

Amorphous silicon is deposited on the buffer layer 111. Then, the amorphous silicon is crystallized into polysilicon in areas except an area intended for the sensor TFT 160.

The crystallization of amorphous silicon to polysilicon can be performed using Solid Phase Crystallization (SPC), Field Enhanced Rapid Thermal Annealing (FERTA), Excimer Laser Annealing (ELA), Sequential Lateral Solidification (SLS), Metal Induced Crystallization (MIC), Metal Induced Lateral Crystallization (MILC), Super Grain Silicon (SGS), etc. These crystallization processes produce polysilicon which are different in grain size and uniformity. The electrical characteristics of TFTs are significantly affected by the grain size and uniformity of polysilicon.

In the current embodiment of the present invention, a polysilicon layer for the first charging electrode 171 of the charging unit 170, the polysilicon layer 181 of the switch TFT 180, and the polysilicon layer 131 of the pixel TFT 130 will be formed using an SGS process.

In more detail, first, an amorphous silicon layer is formed on the buffer layer 111 using Chemical Vapor Deposition (CVD), or the like. Then, a capping layer, such as a silicon nitride layer or a silicon oxide layer, is formed on the amorphous silicon layer using CVD or Plasma-Enhanced CVD (PECVD). The silicon nitride layer or the silicon oxide layer used as the capping layer is adjusted to have a thin thickness or a low density so that a metal catalyst as will be described later can be diffused.

Metal catalyst particles (e.g., nickel (Ni)) are deposited on a portion of the capping layer except a portion intended for the sensor TFT 160 using sputtering, ion implantation, or a plasma process, and then thermally treated to crystallize amorphous silicon. The thermal treatment may be performed by heating in a furnace for a long time, or alternatively, by Rapid Thermal Annealing (RTA). By the thermal treatment, the metal catalyst particles are diffused into the amorphous silicon layer via the capping layer, and the diffused metal catalyst particles form seeds in the amorphous silicon layer. While amorphous silicon is grown from the seeds, neighboring grains meet to form grain boundaries, thereby completing crystallization of amorphous silicon to polysilicon.

When polysilicon is formed using such an SGS process, the number of seeds and grain boundaries can be adjusted to control the characteristics of TFTs and to enhance electron mobility. In addition, since a SGS process is useful in crystallization of fine patterns, in an organic light-emitting display apparatus in which each pixel includes a display region and a sensor region, like in the current embodiment of the present invention, it is advantageous to selectively crystallize amorphous silicon.

After the crystallization, patterning is performed so that desired portions are left. The crystallization may also be preceded by the patterning. Then, the capping layer and residual metal catalyst particles are removed by etching. After removing the capping layer, the first insulating layer 112 is formed using $SiO_2$, SiNx, or the like. Then, a polysilicon layer pattern intended for the first charging electrode 171 is doped with an N- or P-type impurity to complete the first charging electrode 171.

A metal material, e.g., MoW or Al/Cu, is formed on the first insulating layer 112 and patterned. At this time, the sensor gate electrode 162, the second charging electrode 172, the switch gate electrode 182, and the pixel gate electrode 132 are formed on the same plane.

Next, the second insulating layer 113 made of $SiO_2$, SiNx, or the like is formed on the resultant structure.

The first source and drain electrodes 163 and 164, the second source and drain electrodes 183 and 184, and the third source and drain electrodes 133 and 134 are formed on the resultant structure so that they are respectively connected to the amorphous silicon layer 161, the second charging electrode 172, and the polysilicon layers 181 and 131 via the contact holes 165, 175, 185, and 135. Then, the passivation layer 115 and the organic light-emitting layer 140 are formed.

As described above, in the active matrix organic light-emitting display apparatus according to the current embodiment of the present invention, each pixel includes a sensor region sensing light and a display region displaying images. Thus, even without a separate element, the organic light-emitting display apparatus can be easily operated and can display high-quality images.

Hereinafter, an organic light-emitting display apparatus according to another embodiment of the present invention will be described with reference to FIG. 3 and mainly with a view to differences in relation to that of the previous embodiment.

Figure 3:
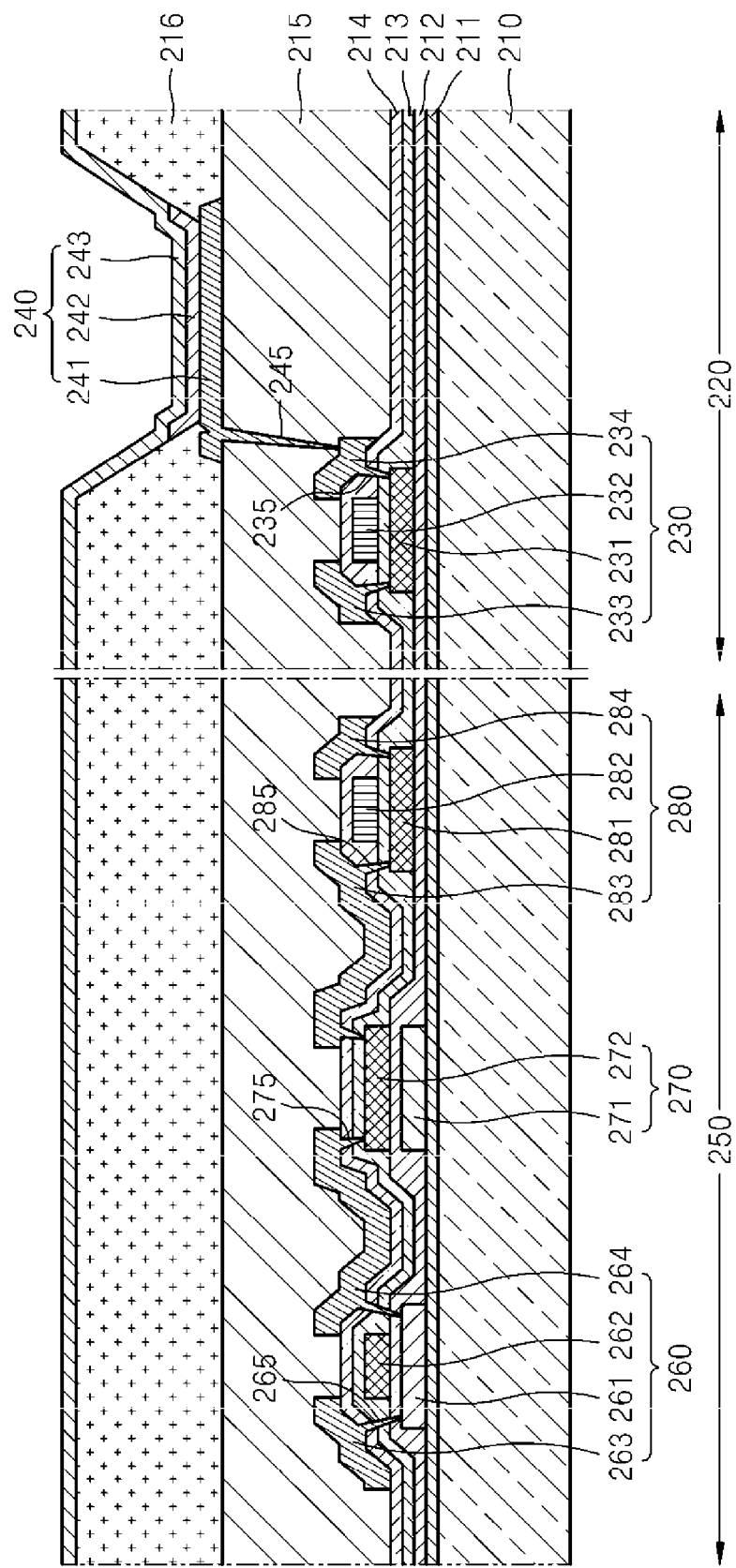
FIG. 3 is a schematic sectional view illustrating a pixel of an organic light-emitting display apparatus according to another embodiment of the present invention.

Referring to FIG. 3, an organic light-emitting display apparatus includes a substrate 210 including a plurality of pixels, and each pixel includes a display region 220 and a sensor region 250.

The substrate 210 may be made of a transparent glass or plastic material including $SiO_2$ as a main component, but the embodiments of the present invention are not limited thereto. Like in the current embodiment of the present invention, in a top-emission type organic light-emitting display apparatus that displays images in an opposite direction to the substrate 210 to achieve a larger aperture ratio, it is not necessary to form the substrate 210 using a transparent material A buffer layer 211 made of $SiO_2$ and/or SiNx may be disposed on the substrate 210 to make the substrate 210 smooth and to prevent the penetration of impurity elements.

Each pixel defined on the substrate 210 includes the display region 220 for displaying images and the sensor region 250 for sensing light and transmitting signals to the display region 220.

The sensor region 250 includes a sensor TFT 260 sensing light, a charging unit 270 storing photocurrent as charges, and a switch TFT 280 selectively releasing the charges stored in the charging unit 270.

The sensor TFT 260 includes an amorphous silicon layer 261, a first insulating layer 212, a sensor gate electrode 262, and a second insulating layer 213. A first source electrode 263 and a first drain electrode 264 are disposed on the second insulating layer 213 so that they are electrically connected to the amorphous silicon layer 261 via contact holes 265.

In order for the sensor TFT 260 to be used as a photosensitive device generating photocurrent, as described above, amorphous silicon with good photo-sensitivity and photo-electric conversion property is used to form a semiconductor layer.

The sensor gate electrode 262 is made of polysilicon, unlike the previous embodiment. A method of forming the sensor gate electrode 262 will be described later.

The amorphous silicon layer 261 is disposed closer to the substrate 210 than the sensor gate electrode 262. Thus, the amorphous silicon layer 261 can sense light incident to the substrate 210. In particular, in a top-emission type organic light-emitting display apparatus, a light receiving plane is opposite to an image display plane, and thus, the display apparatus can easily perform image readout.

The charging unit 270 has a sequential stack structure of a first charging electrode 271, the first insulating layer 212, a second charging electrode 272, and the second insulating layer 213.

Here, the first charging electrode 271 is made of polysilicon and is placed on the same plane as the amorphous silicon layer 261 of the sensor TFT 260.

The second charging electrode 272 is placed on the same plane as the sensor gate electrode 262 of the sensor TFT 260, and is made of polysilicon, unlike the previous embodiment. Methods of forming the first charging electrode 271 and the second charging electrode 272 will be described later.

Meanwhile, photocurrent generated in the amorphous silicon layer 261 of the sensor TFT 260 migrates to the first source electrode 263 or the first drain electrode 264 via the contact holes 265 of the sensor TFT 260 and then to the second charging electrode 272 electrically connected to the first source electrode 263 or the first drain electrode 264 to thereby be stored as charges in the charging unit 270

The switch TFT 280 includes the first insulating layer 212, a polysilicon layer 281, the second insulating layer 213, and a switch gate electrode 282. A third insulating layer 214 is disposed on the switch gate electrode 282, and a second source electrode 283 and a second drain electrode 284 are electrically connected to the polysilicon layer 281 via contact holes 285 of the switch TFT 280.

Here, the polysilicon layer 281 is placed on the same plane as the second charging electrode 272 of the charging unit 270, and is made of polysilicon, like the second charging electrode 272. Polysilicon has better electron mobility than amorphous silicon, thereby guaranteeing a rapid operating speed. Thus, polysilicon is used for a switching device (e.g., a pixel TFT 230 as will be described later) that must be operated together with an element(s) constituting an organic light-emitting device 240.

The switch gate electrode 282 made of a metal material is disposed on the second insulating layer 213.

Meanwhile, charges stored in the charging unit 270 are transmitted to the switch TFT 280 via the second source electrode 283 of the switch TFT 280, and then to the display region 220 via the second drain electrode 284 of the switch TFT 280 electrically connected to the display region 220.

In the current embodiment of the present invention, the sensor TFT 260, the charging unit 270, and the switch TFT 280 constituting the sensor region 250 are electrically connected to each other by the first source and drain electrodes 263 and 264, the second charging electrode 272, and the second source and drain electrodes 283 and 284.

FIG. 3 is an exemplary sectional view cut along the interconnection parts of the sensor TFT 260, the charging unit 270, and the switch TFT 280. However, it should be understood by those of ordinary skill in the art that the sensor TFT 260, the charging unit 270, and the switch TFT 280 can be variously arranged.

The display region 220 includes at least one pixel TFT 230 and an organic light-emitting device 240 electrically connected to the pixel TFT 230.

The pixel TFT 230 includes the first insulating layer 212, a polysilicon layer 231 placed on the same plane as the polysilicon layer 281 of the above-described switch TFT 280, the second insulating layer 213, and a pixel gate electrode 232. Here, the pixel gate electrode 232 is placed on the same plane as the switch gate electrode 282 of the sensor region 250, and is made of a metal material, like the switch gate electrode 282. Methods of forming the elements constituting the pixel TFT 230 will be described later.

The third insulating layer 214 is disposed on the pixel gate electrode 232, and third source and drain electrodes 233 and 234 are electrically connected to the polysilicon layer 231 via contact holes 235.

Meanwhile, one of the third source and drain electrodes 233 and 234 is electrically connected to a first electrode 241 of the organic light-emitting device 240 via hole 245. A passivation layer 215 is interposed between the third source and drain electrodes 233 and 234 and the first electrode 241 to protect TFT devices.

The structures and materials of the passivation layer 215, and the first electrode 241, a light-emitting layer 242, and a second electrode 243 of the organic light-emitting device 240 are as described above, and thus, a description thereof will be omitted.

Although not shown, a sealing member (e.g., glass) sealing the organic light-emitting device 240 may be disposed on the organic light-emitting device 240, and a hygroscopic agent absorbing external moisture or oxygen may be further provided.

FIG. 3 illustrates that the display region 220 includes merely the pixel TFT 230 and the organic light-emitting device 240, but the aspects of the present invention are not limited thereto. Of course, in some cases, the display region 220 can include various compensation circuits, and thus, further include a plurality of TFTs and capacitors. Thus, although not shown, the switch TFT 280 can be directly electrically connected to the pixel TFT 230, and in some cases, can also be electrically connected to various devices arranged in the display region 220.

A method of forming stack structures on the substrate 210 to manufacture the organic light-emitting display apparatus according to the current embodiment of the present invention will now be described in more detail.

First, the buffer layer 211 is deposited on the substrate 210.

Amorphous silicon is deposited on the buffer layer 211. Then, amorphous silicon in areas except an area intended for the sensor TFT 260 is crystallized into polysilicon.

The crystallization of amorphous silicon to polysilicon can be performed using various methods described in the previous embodiment. However, in the current embodiment of the present invention, for the first charging electrode 271 of the charging unit 270, a polysilicon layer will be formed using a SGS process capable of providing good grain size and uniformity and easily forming fine patterns.

In more detail, first, an amorphous silicon layer is formed on the buffer layer 211 using CVD, or the like, and patterned so that amorphous silicon layer portions intended for the amorphous silicon layer 261 of the sensor TFT 260 and the first charging electrode 271 of the charging unit 270 are left. Like in the previous embodiment of the present invention, it should be understood that the crystallization can be preceded by the patterning.

Next, a capping layer, e.g., a silicon nitride layer or a silicon oxide layer, is formed on the resultant structure using CVD or PECVD. The silicon nitride layer or the silicon oxide layer used as the capping layer is adjusted to have a thin thickness or a low density so that a metal catalyst, as will be described later, can be diffused.

Metal catalyst particles (e.g., nickel (Ni)) are deposited on a portion of the capping layer corresponding to the amorphous silicon layer pattern intended for the first charging electrode 271 using sputtering, ion implantation, or a plasma process, and then thermally treated to crystallize amorphous silicon. The thermal treatment is described above.

After the crystallization, the capping layer and residual metal catalyst particles are removed by etching. After removing the capping layer, the first insulating layer 212 is formed using $SiO_2$, SiNx, or the like. Then, the polysilicon layer pattern intended for the first charging electrode 271 is doped with an N- or P-type impurity to complete the first charging electrode 271.

When polysilicon is formed using such a SGS process, the number of seeds and grain boundaries can be adjusted to control the characteristics of TFTs and to enhance electron mobility. In addition, since a SGS process is useful in crystallization of fine patterns, in an organic light-emitting display apparatus in which each pixel includes a display region and a sensor region, like in the current embodiment of the present invention, it is advantageous to selectively crystallize amorphous silicon.

Next, an amorphous silicon layer is again formed on the resultant structure, crystallized, and patterned to form polysilicon layer patterns intended for the sensor gate electrode 262, the second charging electrode 272, the polysilicon layer 281 of the switch TFT 280, and the polysilicon layer 231 of the pixel TFT 230. At this time, the crystallization can be performed using various processes, including a SGS process. The crystallization can also be performed using a low temperature process with excimer laser. The polysilicon layer pattern intended for the second charging electrode 272 is doped with an N- or P-type impurity to complete the second charging electrode 272.

Next, the second insulating layer 213 is formed. A metal material such as MoW or Al/Cu is formed on the second insulating layer 213 and patterned. At this time, the switch gate electrode 282 and the pixel gate electrode 232 are formed on the same plane.

The third insulating layer 214 is formed on the resultant structure, and the first source and drain electrodes 263 and 264, the second source and drain electrodes 283 and 284, and the third source and drain electrodes 233 and 234 are then formed to be respectively connected to the amorphous silicon layer 261, the second charging electrode 272, and the polysilicon layers 281 and 231 via the contact holes 265, 275, 285, and 235. Then, the passivation layer 215 and the organic light-emitting device 240 are formed.

As described above, in the active matrix organic light-emitting display apparatus according to the current embodiments of the present invention, each pixel includes a sensor region sensing light and a display region displaying images. Thus, even without a separate element, the organic light-emitting display apparatus can be easily operated and can display high-quality images.

In an organic light-emitting display apparatus according to the embodiments of the present invention, each pixel includes a sensor region. Thus, it is not necessary to add a separate sensing element, thereby making it possible to manufacture a small-sized organic light-emitting display apparatus. Moreover, signals are directly transmitted to each pixel, thereby increasing an operating speed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pixel of an organic light-emitting display apparatus arranged on a substrate comprising:
    a display region comprising at least one pixel thin film transistor and an organic light emitting device electrically connected to the pixel thin film transistor; and
    a sensor region comprising a sensor thin film transistor, a charging unit, and a switch thin film transistor, wherein:
    the sensor thin film transistor comprises an amorphous silicon layer, a first insulating layer, and a sensor gate electrode that are sequentially stacked;
    the charging unit comprises a first charging electrode, a portion of the first insulating layer, and a second charging electrode that are sequentially stacked, the first charging electrode comprising a polysilicon layer placed on the same plane as the amorphous silicon layer, and the second charging electrode being placed on the same plane as the sensor gate electrode; and
    the switch thin film transistor is electrically connected to the at least one pixel in the display region and comprises a polysilicon layer, a portion of the first insulating layer, and a switch gate electrode that are sequentially stacked, the polysilicon layer being placed on the same plane as the first charging electrode, and the switch gate electrode being placed on the same plane as the second charging electrode.

2. The pixel of the organic light-emitting display apparatus of claim 1, wherein the sensor gate electrode, the second charging electrode, and the switch gate electrode are made of metal.

3. The pixel of the organic light-emitting display apparatus of claim 1, wherein the sensor region comprises a second insulating layer disposed on the sensor gate electrode, the second charging electrode, and the switch gate electrode,
    wherein the sensor thin film transistor comprises a first source electrode and a first drain electrode disposed on the second insulating layer, the first source electrode and the first drain electrode being electrically connected to the amorphous silicon layer via contact holes of the sensor thin film transistor, wherein the switch thin film transistor further comprises a second source electrode and a second drain electrode disposed on the second insulating layer, the second source electrode and the second drain electrode being electrically connected to the polysilicon layer via contact holes of the switch thin film transistor, and wherein one of the first source electrode and the first drain electrode and one of the second source electrode and the second drain electrode are connected to the second charging electrode via contact holes.

4. The pixel of the organic light-emitting display apparatus of claim 1, wherein in the pixel thin film transistor, a polysilicon layer, the first insulating layer, and a pixel gate electrode are sequentially stacked, and the polysilicon layer is placed on the same plane as the amorphous silicon layer of the sensor region.

5. The pixel of the organic light-emitting display apparatus of claim 4, wherein the pixel gate electrode is placed on the same plane as the sensor gate electrode, the second charging electrode, and the switch gate electrode of the sensor region, and is made of metal.

6. The pixel of the organic light-emitting display apparatus of claim 4, wherein the display region further comprises the second insulating layer disposed on the pixel gate electrode, and wherein the pixel thin film transistor comprises a third source electrode and a third drain electrode disposed on the second insulating layer, and the third source electrode and the third drain electrode are electrically connected to the polysilicon layer via contact holes of the pixel thin film transistor.

7. The pixel of the organic light-emitting display apparatus of claim 6, wherein the organic light-emitting device of the display region comprises a first electrode, a light emitting layer, and a second electrode, and wherein the first electrode is connected to one of the third source electrode and the third drain electrode.

8. The pixel of the organic light-emitting display apparatus of claim 1, wherein an image is displayed in an opposite direction to the substrate.

9. The pixel of the organic light-emitting display apparatus of claim 1, wherein the switch thin film transistor in the sensor region is directly electrically connected to the pixel thin film transistor in the display region.

10. A pixel of an organic light-emitting display apparatus arranged on a substrate comprising:
a display region comprising at least one pixel thin film transistor and an organic light emitting device electrically connected to the pixel thin film transistor; and
a sensor region comprising a sensor thin film transistor, a charging unit, and a switch thin film transistor, wherein:
the sensor thin film transistor comprises an amorphous silicon layer, a first insulating layer, a sensor gate electrode, and a second insulating layer that are sequentially stacked;
the charging unit comprises a first charging electrode, a portion of the first insulating layer, a second charging electrode, and a portion of the second insulating layer that are sequentially stacked, the first charging electrode comprising a polysilicon layer placed on the same plane as the amorphous silicon layer and the second charging electrode being placed on the same plane as the sensor gate electrode; and the switch thin film transistor is electrically connected to the at least one pixel in the display region and comprises a portion of the first insulating layer, a polysilicon layer, a portion of the second insulating layer, and a switch gate electrode that are sequentially stacked, the polysilicon layer being placed on the same plane as the second charging electrode.

11. The pixel of the organic light-emitting display apparatus of claim 10, wherein the sensor gate electrode and the first charging electrode are made of polysilicon.

12. The pixel of the organic light-emitting display apparatus of claim 10, wherein the switch gate electrode is made of metal.

13. The pixel of the organic light-emitting display apparatus of claim 10, wherein in the pixel thin film transistor, the first insulating layer, a polysilicon layer, the second insulating layer, and a pixel gate electrode are sequentially stacked, and wherein the polysilicon layer is placed on a same plane as the polysilicon layer of the switch thin film transistor, and the pixel gate electrode is placed on a same plane as the switch gate electrode.

14. The pixel of the organic light-emitting display apparatus of claim 13, wherein the display region comprises the third insulating layer disposed on the pixel gate electrode, and wherein the pixel thin film transistor comprises a third source electrode and a third drain electrode disposed on the third insulating layer, and the third source electrode and the third drain electrode are electrically connected to the polysilicon layer via contact holes of the pixel thin film transistor.

15. The pixel of the organic light-emitting display apparatus of claim 14, wherein the organic light-emitting device comprises a first electrode, a light-emitting layer, and a second electrode, and wherein the first electrode is connected to one of the third source electrode and the third drain electrode.

16. The pixel of the organic light-emitting display apparatus of claim 15, wherein the first electrode is a reflective electrode and the second electrode is a transparent electrode.

17. The pixel of the organic light-emitting display apparatus of claim 10, wherein the sensor region further comprises a third insulating layer disposed on the second insulating layer and the switch gate electrode, wherein the sensor thin film transistor comprises a first source electrode and a first drain electrode disposed on the third insulating layer, the first source electrode and the first drain electrode being electrically connected to the amorphous silicon layer via contact holes of the sensor thin film transistor, wherein the switch thin film transistor comprises a second source electrode and a second drain electrode disposed on the third insulating layer, the second source electrode and the second drain electrode being electrically connected to the polysilicon layer via contact holes of the switch thin film transistor, and wherein one of the first source electrode and the first drain electrode and one of the second source electrode and the second drain electrode are connected to the second charging electrode via contact holes of the charging unit.

18. An organic light-emitting display apparatus comprising a plurality of pixels arranged on a substrate, each pixel comprising:

a display region comprising at least one pixel thin film transistor and an organic light emitting device electrically connected to the pixel thin film transistor; and a sensor region comprising a sensor thin film transistor, a charging unit, and a switch thin film transistor, wherein, the sensor thin film transistor comprises an amorphous silicon layer, a sensor gate electrode, and source/drain electrodes, the amorphous silicon layer being disposed closer than the sensor gate electrode to the substrate, and the switch thin film transistor is electrically connected to the at least one pixel thin film transistor in the display region.

* * * * *